US012795836B2

(12) United States Patent
Fu et al.

(10) Patent No.: US 12,795,836 B2
(45) Date of Patent: Nov. 10, 2026

(54) METHOD FOR MANUFACTURING A CIRCUIT BOARD CONNECTION STRUCTURE

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Chih-Chieh Fu, New Taipei (TW); Yuan-Yu Lin, New Taipei (TW); Quan Yuan, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 627 days.

(21) Appl. No.: 18/233,355

(22) Filed: Aug. 14, 2023

(65) Prior Publication Data

US 2024/0098908 A1 Mar. 21, 2024

Related U.S. Application Data

(63) Continuation-in-part of application No. PCT/CN2022/119140, filed on Sep. 15, 2022.

(51) Int. Cl.
*H05K 3/46* (2006.01)
*H05K 1/09* (2006.01)

(52) U.S. Cl.
CPC .......... *H05K 3/4652* (2013.01); *H05K 1/092* (2013.01); *H05K 2201/0355* (2013.01)

(58) Field of Classification Search
CPC .................. H05K 1/092; H05K 1/115; H05K 2201/0355; H05K 3/0023; H05K 3/022; H05K 3/386; H05K 3/4652; H05K 3/4661
See application file for complete search history.

(56) References Cited

U.S. PATENT DOCUMENTS

2016/0164159 A1* 6/2016 Inagaki ................ H05K 1/0296 333/238
2017/0033036 A1* 2/2017 Kajihara ............. H10W 70/635
2024/0098908 A1* 3/2024 Fu .......................... H05K 1/092

* cited by examiner

*Primary Examiner* — Minh N Trinh
(74) *Attorney, Agent, or Firm* — ScienBiziP, P.C.

(57) ABSTRACT

A method for manufacturing a circuit board connection structure includes: providing a circuit board module that including a first outer wiring layer, and the first outer wiring layer including solder pads; forming a first pyrolytic adhesive layer and an inner wiring layer on the first outer wiring layer; forming a second pyrolytic adhesive layer and a second copper foil layer on the inner wiring layer; defining a plurality of through holes each configured to expose one of the solder pads; forming a copper plating layer on the second copper foil layer, etching the copper plating layer and the second copper foil layer to form a second outer wiring layer, thereby obtaining an intermediate body; heating and washing the intermediate body to remove the first pyrolytic adhesive layer and the second pyrolytic adhesive layer. The present application also provides a circuit board connection structure.

10 Claims, 13 Drawing Sheets

METHOD FOR MANUFACTURING A CIRCUIT BOARD CONNECTION STRUCTURE

FIELD

The subject matter herein generally relates to field of circuit boards, and more particularly, to a circuit board connection structure and a preparation method for the circuit board connection structure.

BACKGROUND

In related arts, antennas are usually connected to circuit boards by PIN hole insertion method. As the wirings of the circuit board becomes more densified, a diameter of the PIN hole becomes smaller, making it difficult for the antenna to be inserted into the PIN hole and increasing the difficulty of the manufacturing process. Moreover, the PIN hole may be aged and loosen during the insertion process, which affects the signal transmission.

SUMMARY

To overcome the above shortcomings, a circuit board connection structure and a preparation method for the circuit board connection structure are needed.

A first aspect of the present application provides a preparation method for a circuit board connection structure, including: providing a circuit board module, the circuit board module including a first outer wiring layer, and the first outer wiring layer including a plurality of solder pads; forming a first pyrolytic adhesive layer and an inner wiring layer on the first outer wiring layer, and the first pyrolytic adhesive layer being between the first outer wiring layer and the inner wiring layer; forming a second pyrolytic adhesive layer and a second copper foil layer on the inner wiring layer, and the second pyrolytic adhesive layer being between the inner wiring layer and the second copper foil layer; defining a plurality of through holes each extending through the second copper foil layer, the second pyrolytic adhesive layer, the inner wiring layer, and the first pyrolytic adhesive layer, each of the plurality of through holes configured to expose one of the plurality of solder pads; forming a copper plating layer on the second copper foil layer, and the copper plating layer further infilling in each of the plurality of through holes to form a conductive post; etching the copper plating layer and the second copper foil layer to form a second outer wiring layer, thereby obtaining an intermediate body; and heating and washing the intermediate body to remove the first pyrolytic adhesive layer and the second pyrolytic adhesive layer, wherein the second outer wiring layer and the inner wiring layer form an antenna module, and the antenna module is connected to each of the plurality of the solder pads through the corresponding conductive post.

In some possible implementations, the conductive post includes a first portion and a second portion, the first portion is connected between the inner wiring layer and the plurality of solder pads, and the second portion is connected between the second outer wiring layer and the inner wiring layer.

In some possible implementations, when viewed from a direction perpendicular to the circuit board connection structure, each of the second outer wiring layer and the inner wiring layer is honeycomb-shaped.

In some possible implementations, a diameter of each of the plurality of through holes is smaller than a width of a respective one of the plurality of solder pads, and an orthogonal projection of each of the plurality of through holes on the respective one of the plurality of solder pads is completely within the respective one of the plurality of solder pads.

In some possible implementations, the first pyrolytic adhesive layer is made of a material selected from a group consisting of epoxy resin, organic silicone, polymer, wax, and any combination thereof.

A second aspect of the present application provides a circuit board connection structure, including a circuit board module and an antenna module. The circuit board module includes a first outer wiring layer, the first outer wiring layer including a plurality of solder pads. The antenna module is a pure metal structure. The antenna module includes an inner wiring layer, a second outer wiring layer, and a conductive post, the inner wiring layer being between the first outer wiring layer and the second outer wiring layer, and the conductive post electrically connecting the plurality of solder pads to the antenna module.

In some possible implementations, the conductive post includes a first portion and a second portion, the first portion is connected between the inner wiring layer and the plurality of solder pads, and the second portion is connected between the second outer wiring layer and the inner wiring layer.

In some possible implementations, when viewed from a direction perpendicular to the circuit board connection structure, each of the second outer wiring layer and the inner wiring layer is honeycomb-shaped.

In some possible implementations, a diameter of each of the plurality of through holes is smaller than a width of a respective one of the plurality of solder pads, and an orthogonal projection of each of the plurality of through holes on the respective one of the plurality of solder pads is completely within the respective one of the plurality of solder pads.

In some possible implementations, the circuit board module further includes a protective layer formed on the first outer wiring layer, and the first outer wiring layer is partially exposed from the protective layer to form the plurality of solder pads.

Compared to the related arts, the antenna module of the present application is connected to the solder pads through the conductive post, and the conductive post is made by hole defining and electroplating. Compared to the existing PIN insertion method, the present application simplifies the electrical connection process between the antenna module and the circuit board module, and can stabilize the signal transmission. Moreover, the antenna module as a whole is presented as a three-dimensional structure of pure metal. The second inner wiring layer and the second outer wiring layer are not connected through another insulation layer, which may reduce the resistance of signal transmission and the overall thickness of the antenna module, thereby improving space utilization.

Implementations of the present disclosure will now be described, by way of embodiments, with reference to the attached figures.

DETAILED DESCRIPTION

Implementations of the disclosure will now be described, by way of embodiments only, with reference to the drawings. It should be noted that non-conflicting details and features in the embodiments of the present disclosure may be combined with each other. In the following description, many specific details are provided to facilitate a full understanding of the embodiments of the present application. The described embodiments are a portion of the embodiments instead of all embodiments of the present application.

Unless otherwise defined, all technical terms used herein have the same meaning as commonly understood by one of ordinary skill in the art. The technical terms used herein are not to be considered as limiting the scope of the embodiments.

Figure 1:
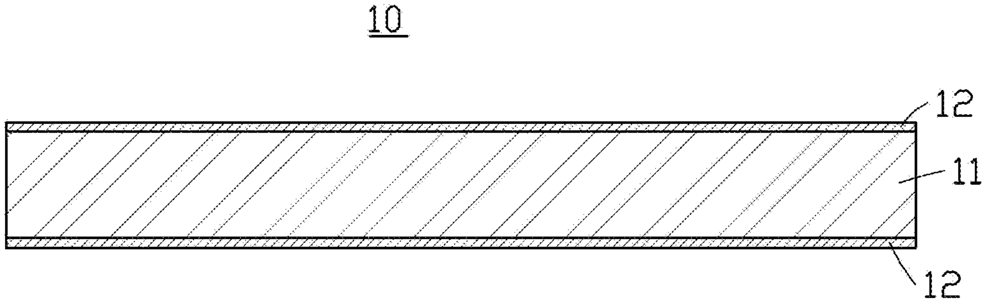
FIG. 1 is a cross-sectional view of a copper-clad substrate according to an embodiment of the present application.
Figure 13:
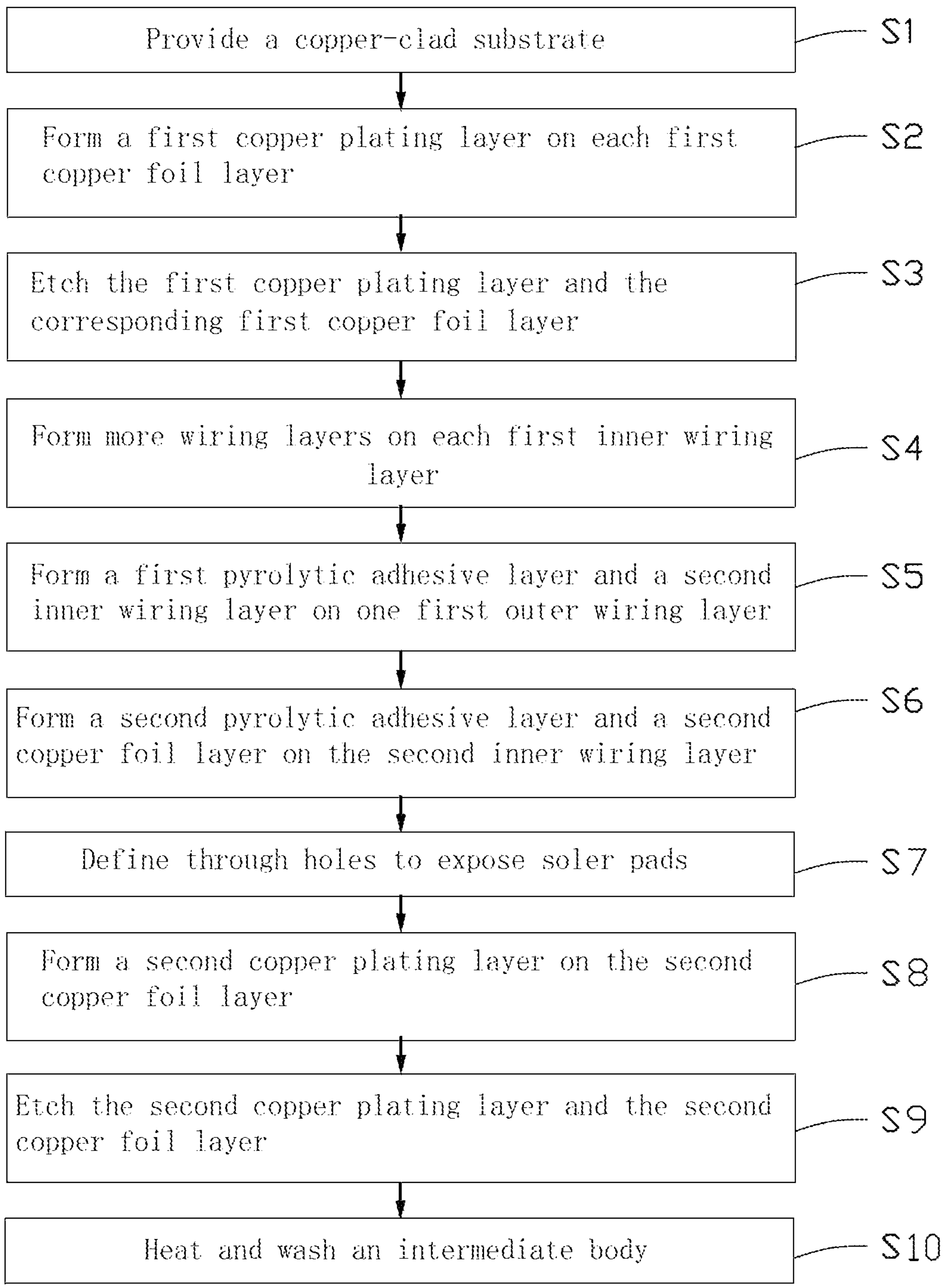
FIG. 13 is a flowchart of a preparation method for a circuit board connection structure according to an embodiment of the present disclosure.

Referring to FIG. 13, an embodiment of the present application provides a preparation method for a circuit board connection structure. According to different requirements, the sequence of different steps of the preparation method can be changed, and certain steps can be omitted or combined with each other. The preparation method includes the following steps:

Step S1, referring to FIG. 1, a copper-clad substrate 10 is provided, which includes a base layer 11 and two first copper foil layers 12 located on opposite surfaces of the base layer 11.

In some embodiments, the base layer 11 is made of a resin selected from a group consisting of epoxy resin (PI), polypropylene (PP), BT resin, polyphenylene oxide (PPO), polyimide (PI), polyethylene terephthalate (PET), polyethylene naphthalate (PEN), and any combination thereof.

Figure 2:
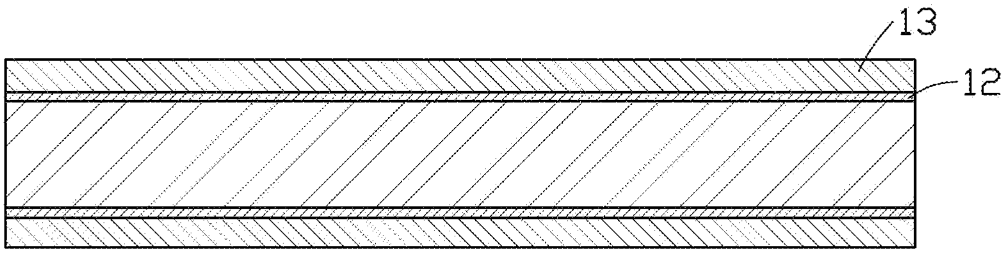
FIG. 2 is a cross-sectional view showing a first copper plating layer being formed on the copper-clad substrate of FIG. 1.

Step S2, referring to FIG. 2, a first copper plating layer 13 is formed on each first copper foil layer 12.

In some embodiments, the first copper plating layer 13 may be formed by electroplating.

Figure 3:
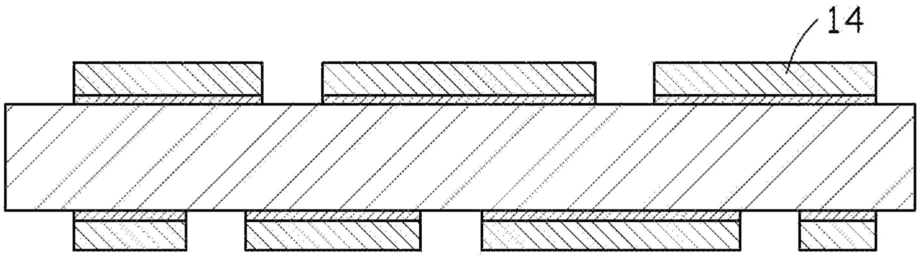
FIG. 3 is a cross-sectional view showing the first copper plating layer of FIG. 2 being etched.

Step S3, referring to FIG. 3, each first copper plating layer 13 and the corresponding first copper foil layer 12 are etched to form a first inner wiring layer 14.

In some embodiments, the first inner wiring layer 14 may be etched by an exposure and development process.

Figure 4:
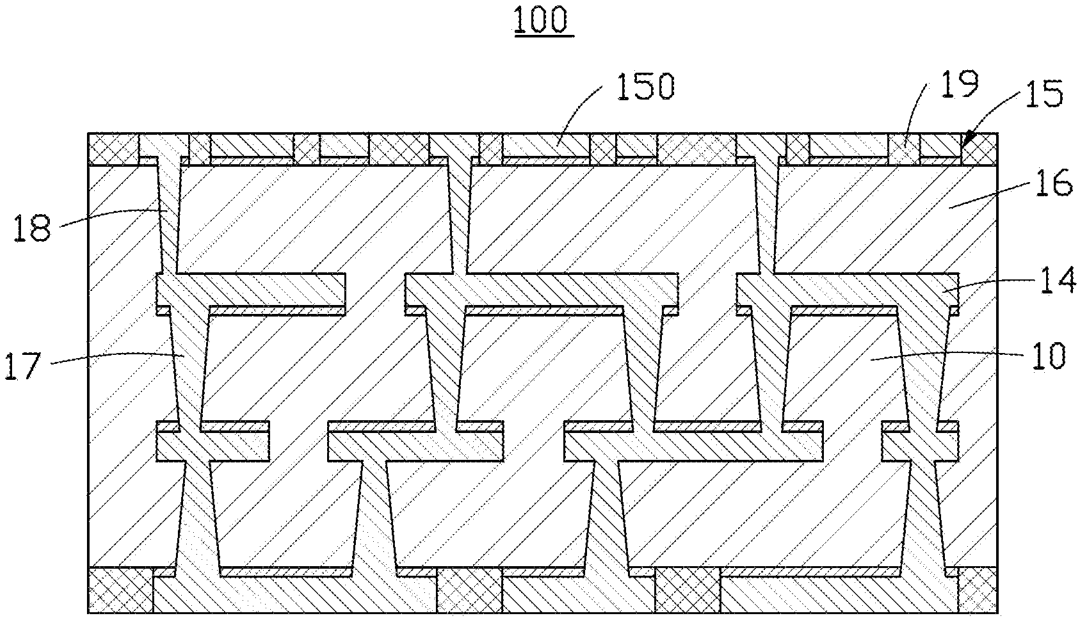
FIG. 4 is a cross-sectional view showing wiring layers being added on a first inner wiring layer of FIG. 3 to obtain a circuit board module.

Step S4, referring to FIG. 4, more wiring layers are formed on each first inner wiring layer 14. After adding the wiring layers, the two outermost wiring layers are first outer wiring layers 15. Each first outer wiring layer 15 includes a number of solder pads 150. Then, a circuit board module 100 is obtained.

In some embodiments, the circuit board module 100 is a four-layered board, that is, the circuit board module 100 includes a total of four wiring layers. An insulation layer 16 is sandwiched between the first inner wiring layer 14 and the first outer wiring layer 15. In other embodiments, the number of wiring layers of circuit board module 100 may be changed. For example, the circuit board module 100 may be a single-sided board, a double-sided board, or a multi-layered board different from the above four-layered board.

In some embodiments, when forming the first inner wiring layer 14, a first opening (not shown) may also be defined in the base layer 11, and a first conductive post 17 may be formed in the first opening. As such, the two first inner wiring layers 14 located on two opposite sides of the base layer 11 are electrically connected to each other through the first conductive post 17. Furthermore, when forming the first outer wiring layer 15, a second hole (not shown) may also be defined in the insulation layer 16, and a second conductive post 18 may be formed in the second hole. As such, the first inner wiring layer 14 and the first outer wiring layer 15 are electrically connected to each other through the second conductive post 18.

In some embodiments, a protective layer 19 may also be formed on each first outer wiring layer 15. The first outer wiring layer 15 is partially exposed from the protective layer 19 to form a solder pad 150. Furthermore, the protective layer 19 may be a solder resistant layer. In other embodiments, the protective layer 19 may also be a resin cover film (CVL).

Figure 5:
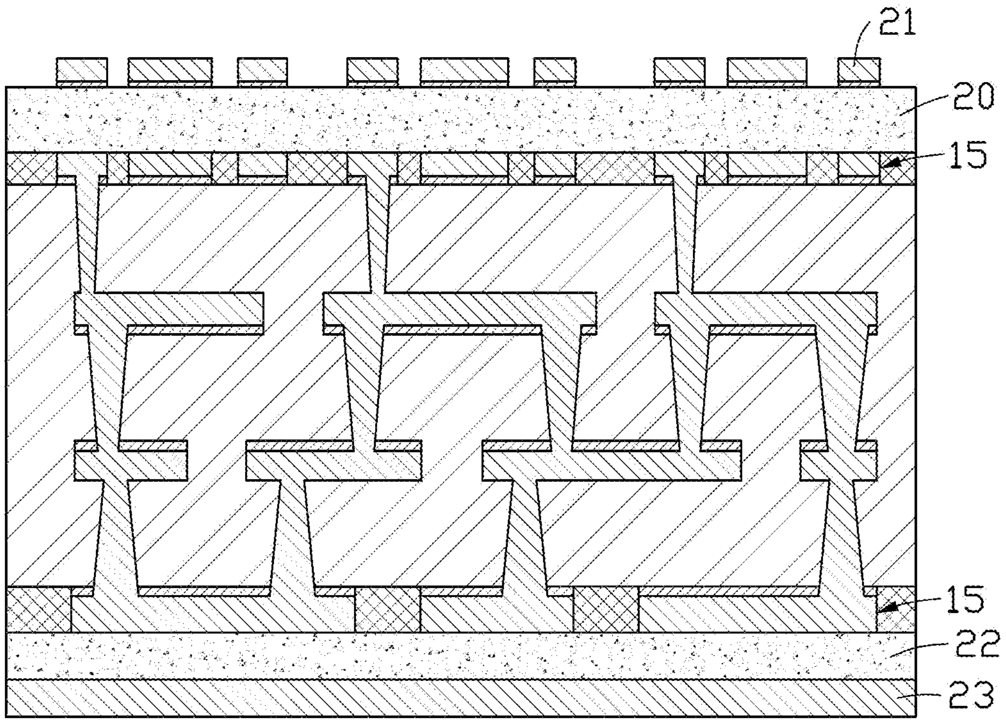
FIG. 5 is a cross-sectional view showing a first pyrolytic adhesive layer and a second inner wiring layer being formed on the circuit board module of FIG. 4.

Step S5, referring to FIG. 5, a first pyrolytic adhesive layer 20 and a second inner wiring layer 21 are formed on one first outer wiring layer 15. The first pyrolytic adhesive layer 20 is located between the first outer wiring layer 15 and the second inner wiring layer 21.

The first pyrolytic adhesive layer 20 may decompose by heating. Optionally, the first pyrolytic adhesive layer 20 is made of a material selected from a group consisting of epoxy resin, organic silicone, polymer, wax, and any combination thereof. In some specific embodiments, a thickness of the first pyrolytic adhesive layer 20 may be substantially 35 microns.

In some embodiments, a third pyrolytic adhesive layer 22 and a third inner wiring layer 23 may be formed on another first outer wiring layer 15. The third pyrolytic adhesive layer 22 is located between the first outer wiring layer 15 and the third inner wiring layer 23. The material and the thickness of the third pyrolytic adhesive layer 22 may be the same as those of the first pyrolytic adhesive layer 20.

Figure 6:
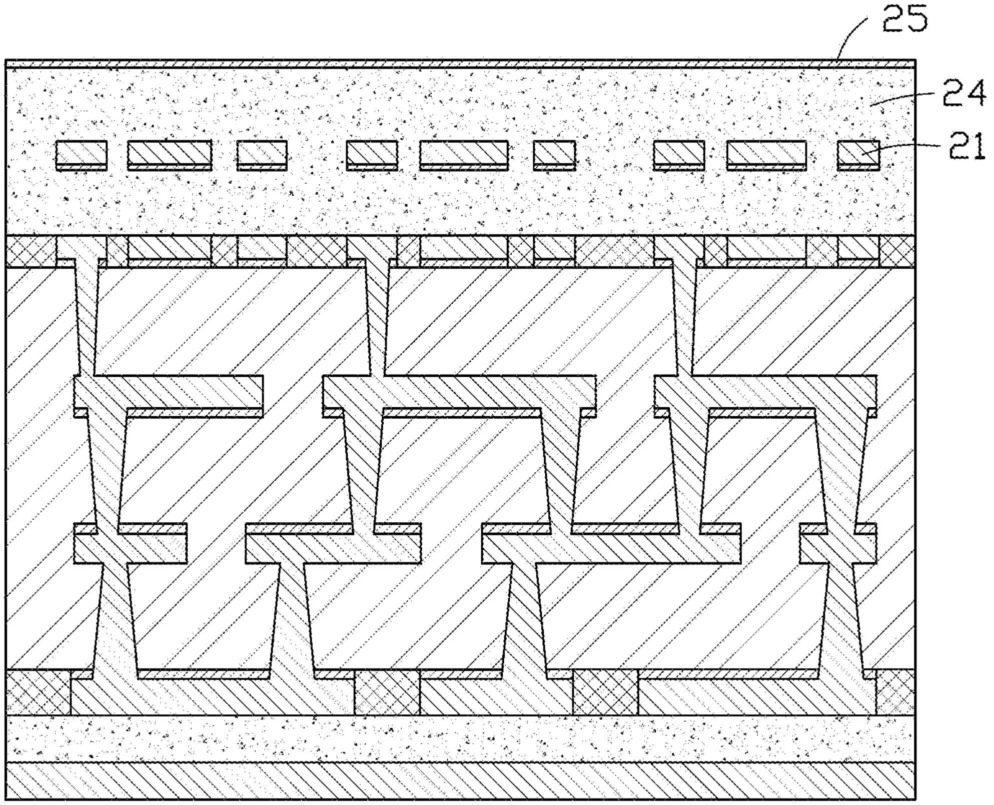
FIG. 6 is a cross-sectional view showing a second pyrolytic adhesive layer and a second copper foil layer being formed on the second inner wiring layer of FIG. 5.

Step S6, referring to FIG. 6, a second pyrolytic adhesive layer 24 and a second copper foil layer 25 are formed on the second inner wiring layer 21. The second pyrolytic adhesive layer 24 is located between the second inner wiring layer 21 and the second copper foil layer 25.

The material and the thickness of the second pyrolytic adhesive layer 24 can be the same as those of the first pyrolytic adhesive layer 20.

Figure 7:
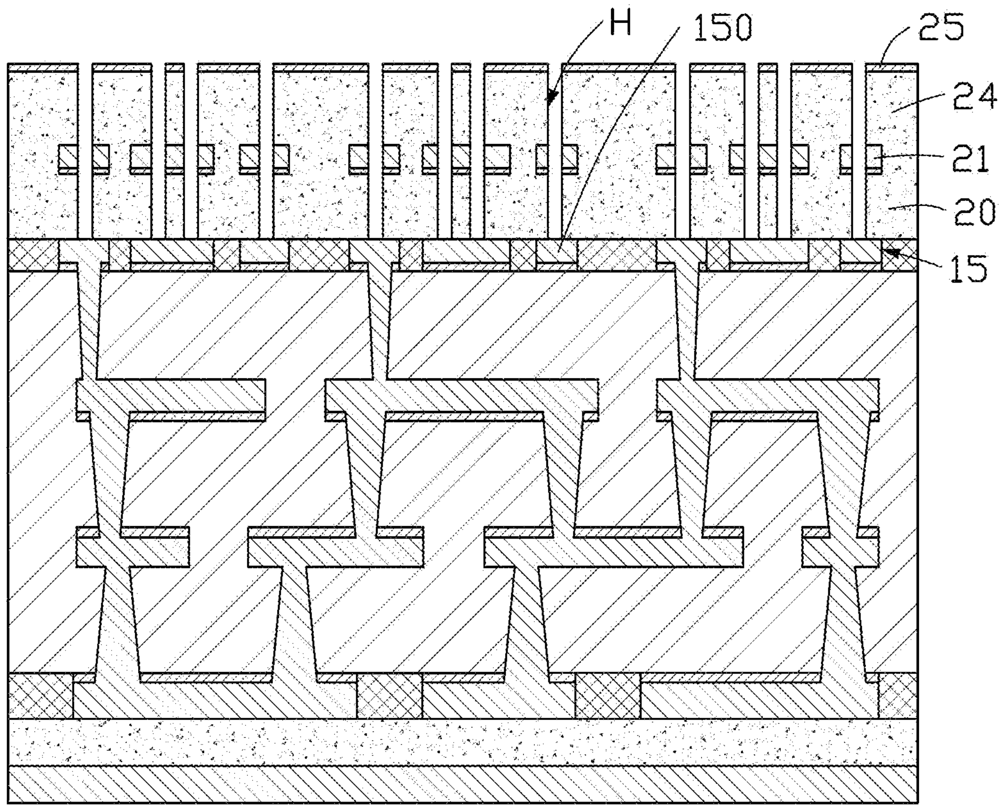
FIG. 7 is a cross-sectional view showing a through hole being defined in the second copper foil layer, the second pyrolytic adhesive layer, the second inner wiring layer, and the first pyrolytic adhesive layer of FIG. 6.

Step S7, referring to FIG. 7, a number of through holes H are defined in the second copper foil layer 25, the second pyrolytic adhesive layer 24, the second inner wiring layer 21, and the first pyrolytic adhesive layer 20. Each of the through hole H is used to expose the solder pad 150.

In some embodiments, a diameter of the through hole H is smaller than a width of the solder pad 150. An orthogonal projection of the through hole H onto the solder pad 150 is totally within the solder pad 150. In some specific embodiments, the diameter of through hole H is substantially 70 microns, and the width of solder pad 150 is substantially 100 microns.

In some embodiments, the through hole H may be formed by laser drilling, plasma cutting, or mechanical drilling.

Figure 8:
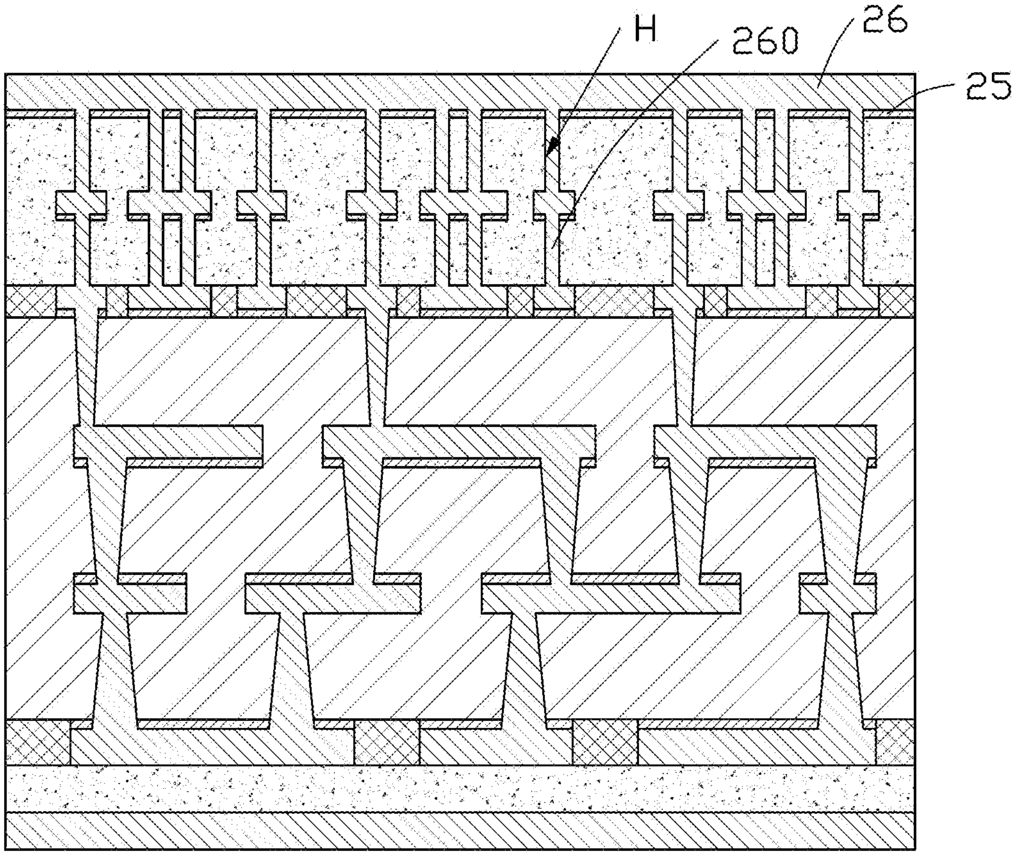
FIG. 8 is a cross-sectional view showing a second copper plating layer being formed on the second copper foil layer of FIG. 7.

Step S8, referring to in FIG. 8, a second copper plating layer 26 is formed on the second copper foil layer 25. The second copper plating layer 26 is also filled in each through hole H to form a third conductive post 260.

Figure 9:
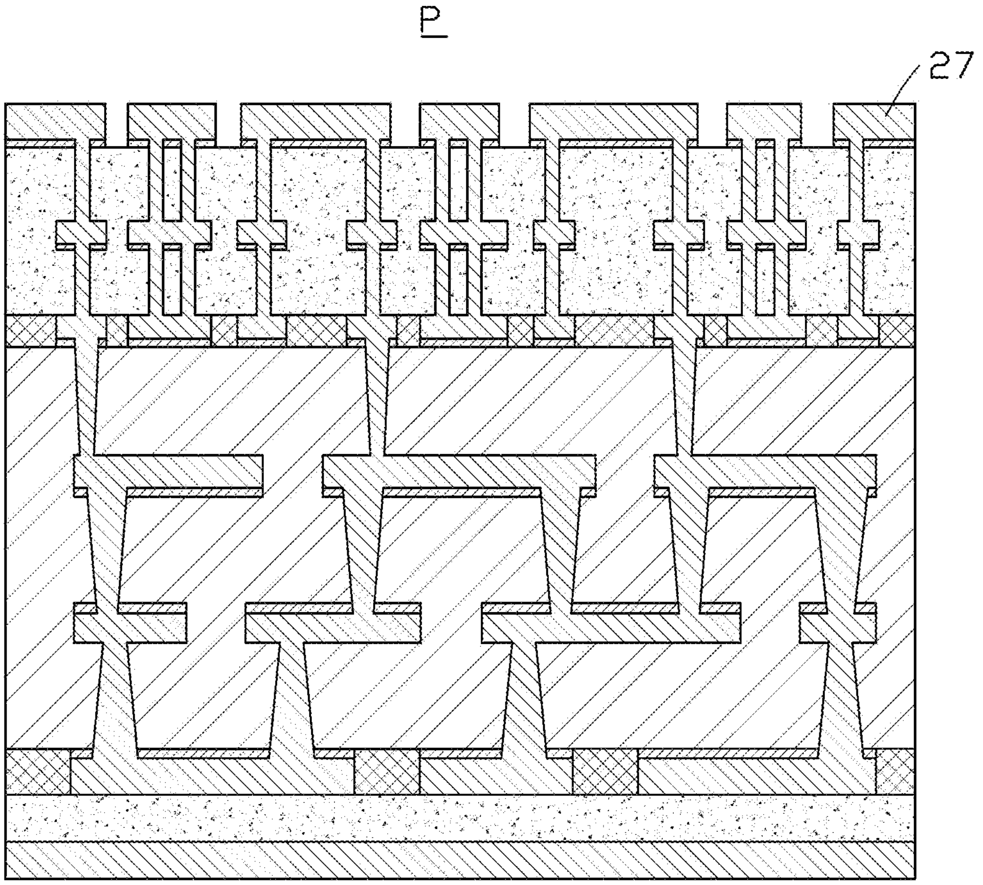
FIG. 9 is a cross-sectional view showing the second copper plating layer and the second copper foil layer of FIG. 8 being etched.

Step S9, referring to FIG. 9, the second copper plating layer 26 and the second copper foil layer 25 are etched to form a second outer wiring layer 27. Then, an intermediate body P is obtained.

Figure 10:
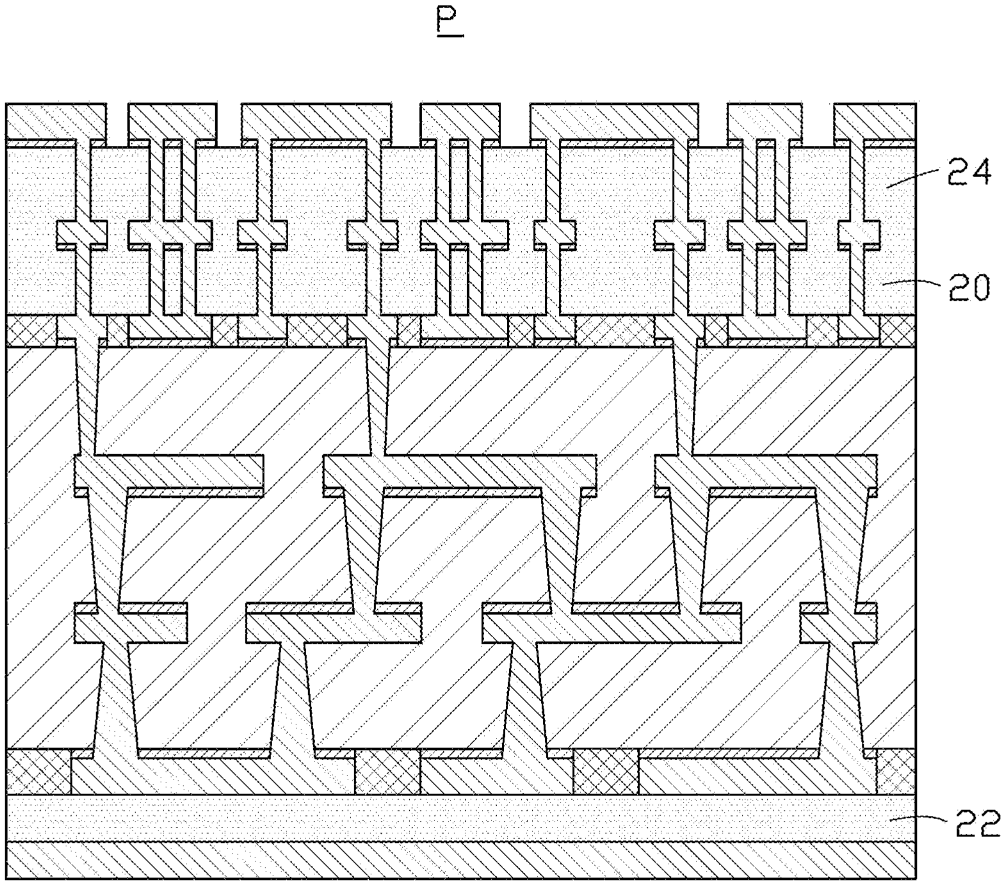
FIG. 10 is a cross-sectional view showing an intermediate body of FIG. 9 being heated.
Figure 11:
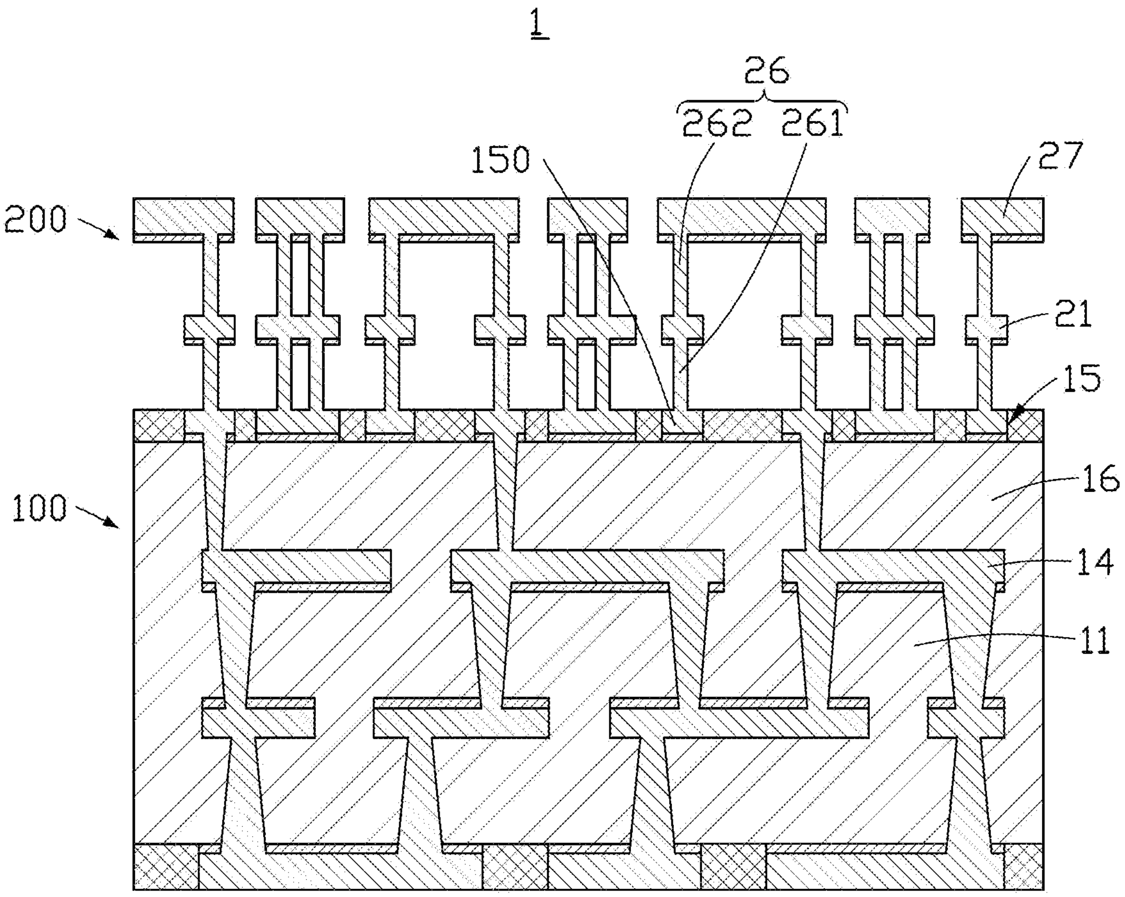
FIG. 11 is a cross-sectional view showing the intermediate body of FIG. 10 being washed to obtain a circuit board connection structure.

Step S10, referring to FIGS. 10 and 11, the intermediate body P is heated to cause the first pyrolytic adhesive layer 20, the third pyrolytic adhesive layer 22, and the second pyrolytic adhesive layer 24 to decompose. The intermediate body P is then washed. The first pyrolytic adhesive layer 20, the third pyrolytic adhesive layer 22, and the second pyrolytic adhesive layer 24 are removed after being washed. Then, the circuit board connection structure 1 is obtained.

In some embodiments, after heating, the intermediate body P may be put into an ultrasonic cleaning machine for washing with water, thereby improving the removal efficiency of residual adhesive.

The second outer wiring layer 27 and the second inner wiring layer 21 cooperatively form an antenna module 200. The antenna module 200 is connected to the solder pad 150 through the third conductive post 260. Specifically, the third conductive post 260 includes a first portion 261 and a second portion 262. The first portion 261 is connected between the second inner wiring layer 21 and the solder pad 150, and can electrically connect the second inner wiring layer 21 to the first outer wiring layer 15. The second portion 262 is connected between the second outer wiring layer 27 and the second inner wiring layer 21, and can electrically connect the second outer wiring layer 27 to the second inner wiring layer 21. The third conductive post 260 is made by hole defining and electroplating. Compared to the existing PIN insertion method, the present application simplifies the electrical connection process between the antenna module 200 and the circuit board module 100, and can stabilize the signal transmission. Moreover, the above preparation process in the present application can prepare wirings with a specification less than 150 microns, thereby realizing the production of a miniature antenna module 200. In the embodiment, the antenna module 200 includes the second inner wiring layer 21 and the second outer wiring layer 27 stacked together, and the antenna module 200 as a whole is presented as a three-dimensional structure of pure metal. The second inner wiring layer 21 and the second outer wiring layer 27 are not connected through another insulation layer 16, which may reduce the resistance of signal transmission and the overall thickness of the antenna module 200, thereby improving space utilization.

Figure 12:
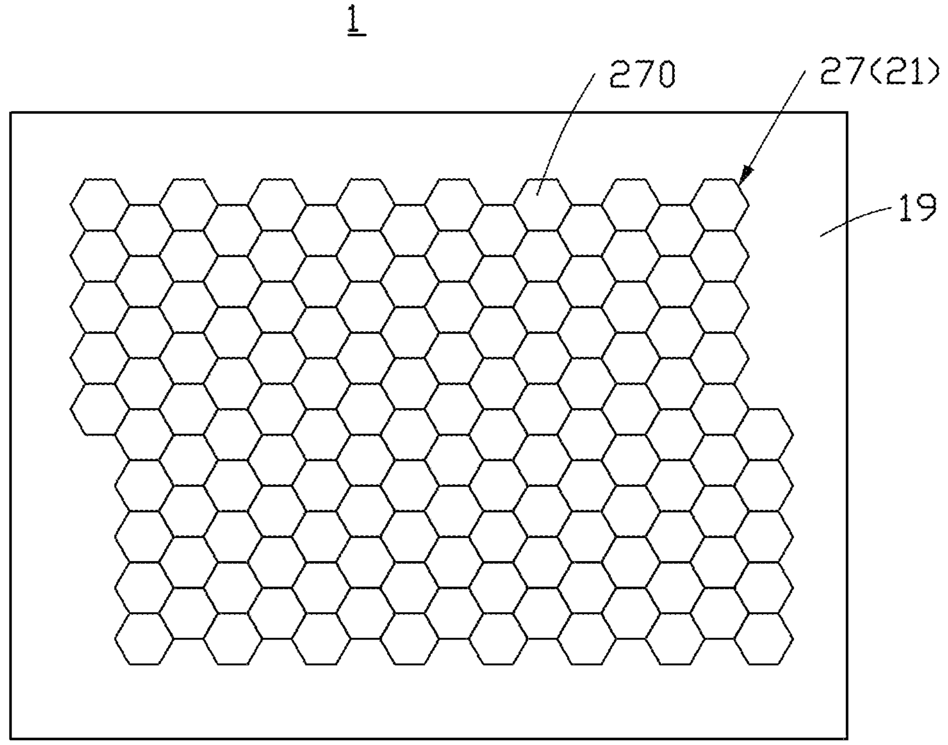
FIG. 12 is a top view of the circuit board connection structure of FIG. 11.

Furthermore, referring to FIG. 12, when being viewed from a direction perpendicular to the circuit board connection structure 1, each of the second outer wiring layer 27 and the second inner wiring layer 21 may be honeycomb-shaped. That is, the antenna module 200 is a three-dimensional honeycomb antenna. Specifically, for example, the second outer wiring layer 27 includes a number of wiring areas 270 connected together. Each of the wiring areas 270 is substantially a hexagonal structure. The wiring layer with honeycomb structure has a high structural strength.

Referring to FIG. 11, a circuit board connection structure 1 is provided according to another embodiment of the present application, which includes a circuit board module 100 and an antenna module 200.

The circuit board module 100 includes a base layer 11, a first inner wiring layer 14, an insulation layer 16, and a first outer wiring layer 15 that are sequentially stacked together. The first outer wiring layer 15 includes a number of solder pads 150.

The antenna module 200 includes a second inner wiring layer 21, a second outer wiring layer 27, and a third conductive post 260. The second inner wiring layer 21 is located between the first outer wiring layer 15 and the second outer wiring layer 27. The third conductive post 260 includes a first portion 261 and a second portion 262. The first portion 261 is connected between the second inner wiring layer 21 and the solder pad 150, and can electrically connect the second inner wiring layer 21 to the first outer wiring layer 15. The second portion 262 is connected between the second outer wiring layer 27 and the second inner wiring layer 21, and can electrically connect the second outer wiring layer 27 to the second inner wiring layer 21. The antenna module 200 as a whole is presented as a three-dimensional structure of pure metal. The second inner wiring layer 21 and the second outer wiring layer 27 are not connected through another insulation layer 16. In other embodiments, the antenna module 200 may also include an intermediate wiring layer (not shown) located between the second inner wiring layer 21 and the second outer wiring layer 27.

Furthermore, referring to FIG. 12, when viewed from a direction perpendicular to the circuit board connection structure 1, each of the second outer wiring layer 27 and the second inner wiring layer 21 may be honeycomb-shaped. That is, the antenna module 200 is a three-dimensional honeycomb antenna.

It can be understood that for one having ordinary skill in the art, various other changes and deformations may be made based on the technical concept of the present application, and all these changes and deformations should fall within the protection scope of the claims of the present application.

What is claimed is:

1. A preparation method for a circuit board connection structure, comprising:

providing a circuit board module, the circuit board module comprising a first outer wiring layer, and the first outer wiring layer comprising a plurality of solder pads;

forming a first pyrolytic adhesive layer and an inner wiring layer on the first outer wiring layer, and the first pyrolytic adhesive layer being between the first outer wiring layer and the inner wiring layer;

forming a second pyrolytic adhesive layer and a second copper foil layer on the inner wiring layer, and the second pyrolytic adhesive layer being between the inner wiring layer and the second copper foil layer;

defining a plurality of through holes each extending through the second copper foil layer, the second pyrolytic adhesive layer, the inner wiring layer, and the first pyrolytic adhesive layer, each of the plurality of through holes configured to expose one of the plurality of solder pads;

forming a copper plating layer on the second copper foil layer, and the copper plating layer further infilling in each of the plurality of through holes to form a conductive post;

etching the copper plating layer and the second copper foil layer to form a second outer wiring layer, thereby obtaining an intermediate body; and heating and washing the intermediate body to remove the first pyrolytic adhesive layer and the second pyrolytic adhesive layer, wherein the second outer wiring layer and the inner wiring layer form an antenna module, and the antenna module is connected to each of the plurality of the solder pads through a corresponding conductive post.

2. The preparation method for the circuit board connection structure according to claim 1, wherein the conductive post comprises a first portion and a second portion, the first portion is connected between the inner wiring layer and the plurality of solder pads, and the second portion is connected between the second outer wiring layer and the inner wiring layer.

3. The preparation method for the circuit board connection structure according to claim 1, wherein when viewed from a direction perpendicular to the circuit board connection structure, a top view of the second outer wiring layer is honeycomb-shaped.

4. The preparation method for the circuit board connection structure according to claim 1, wherein when viewed from a direction perpendicular to the circuit board connection structure, a top view of the inner wiring layer is honeycomb-shaped.

5. The preparation method for the circuit board connection structure according to claim 1, wherein a diameter of each of the plurality of through holes is smaller than a width of a respective one of the plurality of solder pads.

6. The preparation method for the circuit board connection structure according to claim 5, wherein an orthogonal projection of each of the plurality of through holes on the respective one of the plurality of solder pads is completely within the respective one of the plurality of solder pads.

7. The preparation method for the circuit board connection structure according to claim 1, wherein the first pyrolytic adhesive layer is made of a material selected from a group consisting of epoxy resin, organic silicone, polymer, wax, and any combination thereof.

8. The preparation method for the circuit board connection structure according to claim 1, wherein the second pyrolytic adhesive layer is made of a material selected from a group consisting of epoxy resin, organic silicone, polymer, wax, and any combination thereof.

9. The preparation method for the circuit board connection structure according to claim 1, wherein the etching of the copper plating layer and the second copper foil layer comprises etching the copper plating layer and the second copper foil layer by an exposure and development process.

10. The preparation method for the circuit board connection structure according to claim 1, wherein the defining the plurality of through holes comprises forming the plurality of through holes by laser drilling, plasma cutting, or mechanical drilling.

* * * * *